United States Patent
Yosui

(10) Patent No.: US 10,709,020 B2
(45) Date of Patent: Jul. 7, 2020

(54) COMPONENT-EMBEDDED SUBSTRATE AND METHOD FOR MANUFACTURING COMPONENT-EMBEDDED SUBSTRATE

(71) Applicant: Murata Manufacturing Co., Ltd., Nagaokakyo-shi, Kyoto-fu (JP)

(72) Inventor: Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/147,925

(22) Filed: Oct. 1, 2018

(65) Prior Publication Data

US 2019/0037702 A1    Jan. 31, 2019

Related U.S. Application Data

(63) Continuation of application No. PCT/JP2017/017774, filed on May 11, 2017.

(30) Foreign Application Priority Data

May 18, 2016    (JP) ................................. 2016-099801

(51) Int. Cl.
   *H05K 1/18*    (2006.01)
   *H05K 1/11*    (2006.01)
   *H05K 3/46*    (2006.01)

(52) U.S. Cl.
   CPC ............. *H05K 1/186* (2013.01); *H05K 1/112* (2013.01); *H05K 3/4655* (2013.01);
   (Continued)

(58) Field of Classification Search
   CPC ........... H05K 1/112; H05K 1/18; H05K 1/186
   See application file for complete search history.

(56) References Cited

U.S. PATENT DOCUMENTS 6,512,182 B2*  1/2003  Takeuchi ............. H01L 21/568
                                                    174/255
7,594,318 B2*  9/2009  Zollo ...................... H05K 1/184
                                                    29/832
(Continued)

FOREIGN PATENT DOCUMENTS

JP    2001-210955 A    8/2001
JP    2003-086949 A    3/2003
(Continued)

OTHER PUBLICATIONS

Official Communication issued in International Patent Application No. PCT/JP2017/017774, dated Jun. 20, 2017.

*Primary Examiner* — Binh B Tran
*Assistant Examiner* — Hiram E Gonzalez
(74) *Attorney, Agent, or Firm* — Keating & Bennett, LLP

(57) ABSTRACT

A component-embedded substrate includes a laminate and first and second components. The laminate includes resin layers each made of thermoplastic that are laminated together. The first and second components are embedded in the laminate. The first component has a length in the lamination direction that is greater than a length of the first component in a first direction orthogonal or substantially orthogonal to the lamination direction. The first and second components are disposed adjacent to each other in the first direction, and are disposed at respective positions overlapping with each other as viewed from the first direction. A distance between the first and second components in the first direction is less than the length of the first component in the lamination direction.

12 Claims, 6 Drawing Sheets

(52) U.S. Cl.
CPC ......... *H05K 3/4617* (2013.01); *H05K 3/4697* (2013.01); *H05K 2201/0129* (2013.01); *H05K 2201/0141* (2013.01); *H05K 2201/10454* (2013.01); *H05K 2201/10522* (2013.01); *H05K 2203/068* (2013.01)

(56) References Cited

U.S. PATENT DOCUMENTS

| | | | |
|---|---|---|---|
| 8,284,562 B2* | 10/2012 | Lee | H05K 1/185 |
| | | | 361/761 |
| 2002/0033378 A1* | 3/2002 | Hayashi | H01G 4/40 |
| | | | 216/11 |
| 2002/0192442 A1 | 12/2002 | Kondo et al. | |
| 2005/0030725 A1 | 2/2005 | Galvagni et al. | |
| 2011/0216513 A1 | 9/2011 | Lee et al. | |
| 2013/0213699 A1 | 8/2013 | Chisaka | |
| 2014/0029222 A1* | 1/2014 | Saito | H05K 1/186 |
| | | | 361/762 |
| 2016/0157354 A1* | 6/2016 | Tago | H05K 1/0298 |
| | | | 361/763 |
| 2016/0330844 A1 | 11/2016 | Otsubo | |
| 2017/0347447 A1* | 11/2017 | Sakai | H05K 1/0278 |

FOREIGN PATENT DOCUMENTS

| | | |
|---|---|---|
| JP | 2007-535123 A | 11/2007 |
| JP | 2011-187919 A | 9/2011 |
| JP | 2013-102047 A | 5/2013 |
| WO | 2012/046829 A1 | 4/2012 |
| WO | 2015/156141 A1 | 10/2015 |

* cited by examiner

COMPONENT-EMBEDDED SUBSTRATE AND METHOD FOR MANUFACTURING COMPONENT-EMBEDDED SUBSTRATE

CROSS REFERENCE TO RELATED APPLICATIONS

This application claims the benefit of priority to Japanese Patent Application No. 2016-099801 filed on May 18, 2016 and is a Continuation Application of PCT Application No. PCT/JP2017/017774 filed on May 11, 2017. The entire contents of each application are hereby incorporated herein by reference.

BACKGROUND OF THE INVENTION

1. Field of the Invention

The present invention relates to a component-embedded substrate in which components are mounted.

2. Description of the Related Art

WO 2012/046829 A discloses a component-embedded substrate including a multilayer substrate in which components are embedded. The component-embedded substrate disclosed in WO 2012/046829 A includes a multilayer substrate in which a plurality of resin layers each made of thermoplastic resin are laminated.

In the multilayer substrate, a frame-shaped pattern surrounding components in plan view of the multilayer substrate, is formed. The frame-shaped pattern is formed of a conductor. This reduces a flow of resin when a plurality of resin layers are laminated and heated while being pressed.

Unfortunately, even when a frame-shaped pattern as disclosed in WO 2012/046829 A is provided, a flow of resin may occur. In particular, a component embedded in a multilayer substrate is likely to be affected by a flow of resin to cause the component to be easily displaced when a length of the component (a height of the component) in a plurality of resin layers in its lamination direction is more than a length of the component (a width or length of the component) in the plurality of resin layers in a direction orthogonal to the lamination direction.

Displacement of the component may cause a problem in that the component cannot be connected to a desired conductor, or is connected to an undesired conductor.

SUMMARY OF THE INVENTION

Preferred embodiments of the present invention provide component-embedded substrates that are each capable of reducing displacement of a component even when the component has a length in a plurality of resin layers in its lamination direction that is more than a length in the plurality of resin layers in a direction orthogonal or substantially orthogonal to the lamination direction.

The component-embedded substrate according to a preferred embodiment of the present invention includes a laminate, a first component, and a second component. The laminate includes a plurality of resin layers each made of thermoplastic that are laminated together. The first component and the second component are embedded in the laminate. The first component has a length in a lamination direction that is more than a length of the first component in a direction orthogonal or substantially orthogonal to the lamination direction. The first component and the second component are disposed adjacent to each other in a first direction orthogonal or substantially orthogonal to the lamination direction, and are disposed at respective positions overlapping with each other as viewed from the first direction. A distance between the first component and the second component in the first direction is less than the length of the first component in the lamination direction.

In this structure, the second component is disposed closer to the first component at a distance less than the length of the first component in the lamination direction, in the first direction (the direction orthogonal or substantially orthogonal to the lamination direction) of the laminate. This causes the first component to be less likely to fall even when resin flows.

In a component-embedded substrate according to a preferred embodiment of the present invention, it is preferable that the distance between the first component and the second component in the first direction is less than the length of the second component in the lamination direction.

This structure causes not only the first component but also the second component to be less likely to fall even when the resin flows.

It is preferable that a component-embedded substrate according to a preferred embodiment of the present invention is configured as follows. The component-embedded substrate includes a third component embedded in the laminate and disposed at a position overlapping with the first component as viewed from the first direction. The third component is disposed on a side opposite to the second component with respect to the first component in the first direction.

In this structure, the first component is interposed between the second component and the third component in the first direction, so that the first component is even less likely to fall.

It is preferable that a component-embedded substrate according to a preferred embodiment of the present invention is configured as follows. The component-embedded substrate includes a fourth component embedded in the laminate. The fourth component is disposed adjacent to the first component in a second direction orthogonal or substantially orthogonal to the lamination direction at a position overlapping with the first component as viewed from the second direction. A distance between the first component and the fourth component in the second direction is less than the length of the first component in the lamination direction.

In this structure, the components are disposed close to each other in two directions orthogonal or substantially orthogonal to each other with respect to the first component, so that the first component is even less likely to fall.

A method for manufacturing a component-embedded substrate according to a preferred embodiment of the present invention includes a step of forming a first through hole to receive a component and a second through hole to receive a component in a specific resin layer in a plurality of thermoplastic resin layers, a step of laminating a plurality of resin layers by inserting and disposing a first component into the first through hole to receive a component and inserting and disposing a second component into the second through hole to receive a component, and a step of heat-pressing a laminate of the plurality of resin layers. A distance between the first through hole to receive a component and the second through hole to receive a component is less than a length of the first component in a lamination direction of the plurality of resin layers.

According to this manufacturing method, the first component and the second component are able to be easily disposed inside the laminate with the first component and the second component being close to each other. This facilitates manufacture of the component-embedded substrate in which the first component is less likely to fall.

In a method for manufacturing a component-embedded substrate according to a preferred embodiment of the present invention, it is preferable that the distance between the first through hole to receive a component and the second through hole to receive a component is less than a length of the second component in the lamination direction of the plurality of resin layers.

This manufacturing method facilitates manufacture of the component-embedded substrate in which both of the first component and the second component are less likely to fall.

According to preferred embodiments of the present invention, even when the length of the component in the lamination direction of the plurality of resin layers is more than the length of the component in the direction orthogonal or substantially orthogonal to the lamination direction, displacement of the component is able to be reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
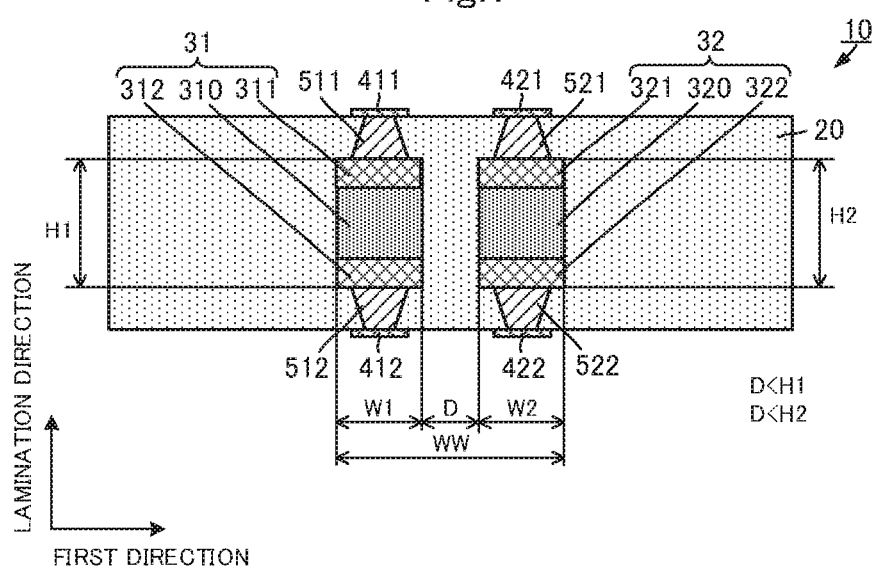
FIG. 1 is a side sectional view illustrating a structure of a component-embedded substrate 10 according to a first preferred embodiment of the present invention.
Figure 2:
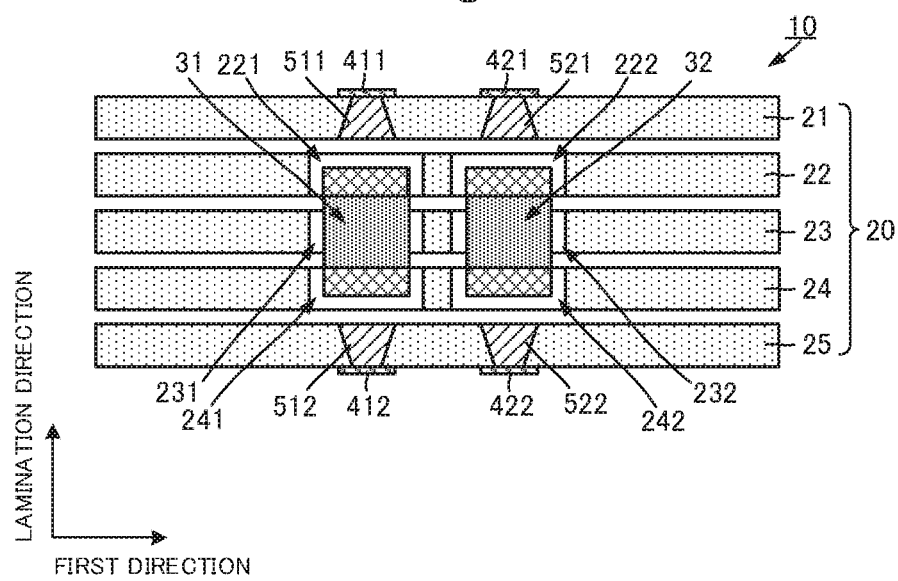
FIG. 2 is a side sectional view in a disassembled state, illustrating the structure of the component-embedded substrate 10 according to the first preferred embodiment of the present invention.
Figure 3:
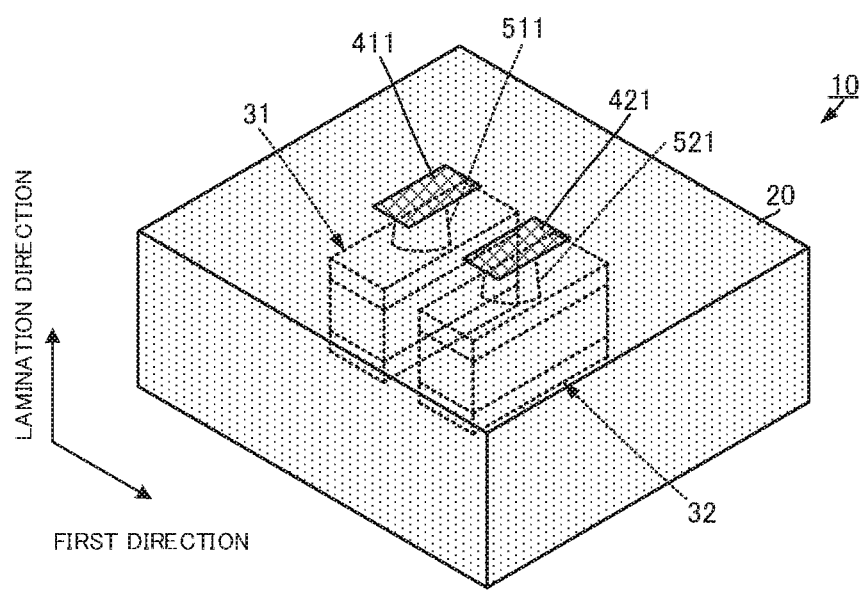
FIG. 3 is an external perspective view of the component-embedded substrate 10 according to the first preferred embodiment of the present invention.

Component-embedded substrates according to preferred embodiments of the present invention will be described with reference to accompanying drawings. FIG. 1 is a side sectional view illustrating a structure of a component-embedded substrate 10 according to a first preferred embodiment of the present invention. FIG. 2 is a side sectional view in a disassembled state, illustrating the structure of the component-embedded substrate 10 according to the first preferred embodiment of the present invention. FIG. 3 is an external perspective view of the component-embedded substrate 10 according to the first preferred embodiment of the present invention. In FIG. 3, illustration of external conductors 412 and 422 on a back surface side and interlayer connection conductors 512 and 522 is omitted.

As illustrated in FIGS. 1, 2, and 3, the component-embedded substrate 10 includes a laminate 20, a component 31, a component 32, a plurality of external conductors 411, 412, 421, and 422, and a plurality of interlayer connection conductors 511, 512, 521, and 522. The components 31 and 32 correspond to the "first component" and the "second component", respectively.

The laminate 20 includes a plurality of resin layers 21, 22, 23, 24, and 25. The plurality of resin layers 21, 22, 23, 24, and 25 each are preferably made of a thermoplastic resin, for example. The plurality of resin layers 21, 22, 23, 24, and 25 each are preferably mainly made of a liquid crystal polymer, for example. The plurality of resin layers 21, 22, 23, 24, and 25 are laminated with main surfaces of adjacent resin layers being in contact with each other. A direction in which the plurality of resin layers 21, 22, 23, 24, and 25 are laminated is a lamination direction of the resin layers. Then, one direction orthogonal or substantially orthogonal to the lamination direction is a first direction.

When the plurality of resin layers 21, 22, 23, 24, and 25 are heat-pressed while being laminated, resin of each layer flows to bond the plurality of resin layers 21, 22, 23, 24, and 25 to each other. As a result, the laminate 20 is provided.

The component 31 includes a component body 310, and a plurality of terminal conductors 311 and 312. The component 31 is harder than the laminate 20. The terminal conductor 311 and the terminal conductor 312 are aligned or substantially aligned in the lamination direction of the resin layers. The component 31 has a length in the lamination direction of the resin layer, indicated as H1. The component 31 has a length in the first direction, indicated as W1. The length H1 in the lamination direction is preferably greater than the length W1 in the first direction.

The component 32 includes a component body 320, and a plurality of terminal conductors 321 and 322. The component 32 is harder than the laminate 20. The terminal conductor 321 and the terminal conductor 322 are aligned or substantially aligned in the lamination direction of the resin layers. The component 32 has a length in the lamination direction of the resin layer, indicated as H2. The component 32 has a length in the first direction, indicated as W2. The length H2 in the lamination direction is preferably greater than the length W2 in the first direction.

The component 31 and the component 32 are disposed inside the laminate 20. The component 31 and the component 32 are disposed at respective positions overlapping with each other as viewed from the first direction. The component 31 and the component 32 are disposed side by side in the first direction. A distance between the component 31 and the component 32 in the first direction is indicated as D. The distance D between the component 31 and the component 32 is preferably less than the length H1 of the component 31 in the lamination direction (D<H1). The distance D between the component 31 and the component 32 is preferably less than the length H2 of the component 32 in the lamination direction (D<H2). A distance WW between a surface of the component 31 on a side opposite to a component 32 side and a surface of the component 32 on a side opposite to a component 31 side is preferably more than the length H1 of the component 31 in the lamination direction and the length H2 of the component 32 in the lamination direction.

When the component 31 is solely disposed inside the laminate, the length H1 in the lamination direction is preferably greater than the length W1 in the first direction. As a result, the component 31 is likely to turn sideways due to a flow of resin during the heat-pressing described above. However, as described in the present preferred embodiment, when the distance D between the component 31 and the component 32 is less than the length H1 of the component 31 in the lamination direction, that is, when the component 32 is disposed close to the component 31 in the first direction at a position overlapping with the component 31 as viewed from the first direction, turning sideways of the component 31 is effectively reduced or prevented and displacement of the component 31 due to a flow of resin is also reduced. Similarly, the component is effectively reduced or prevented turning sideways of the component 32 and displacement of the component 32 is reduced.

While an example in which the length H1 of the component 31 in the lamination direction and the length H2 of the component in the lamination direction are preferably identical or substantially identical (H1=H2) is described in the present preferred embodiment, the length H1 of the component 31 may be different from the length H2 of the component 32 as long as the component 31 is disposed at a position overlapping with the component 32 as viewed from the first direction. For example, the length H2 of the component 32 in the lamination direction may be less than the length H1 of the component 31 in the lamination direction (H1>H2). At that time, turning sideways of the component 31 is reduced or prevented as long as a relationship of D<H1 is satisfied. In addition, when a relationship of D<H2 is also simultaneously satisfied, turning sideways of the component 32 is also simultaneously reduced or prevented.

In addition, it is preferable that the distance WW, in the first direction, between the surface of the component 31 on the side opposite to the component 32 side and the surface of the component 32 on the side opposite to the component 31 side is greater than the length H1 of the component 31 in the lamination direction (WW>H1). This causes a region in which the component 31 and the component 32 are disposed close to each other to be less likely to be displaced to have a shape with a dimension in the first direction larger than that in the lamination direction. As a result, deformation and displacement of this region during lamination and heat pressing are reduced.

The terminal conductor 311 of the component 31 embedded as described above is connected to the external conductor 411 via the interlayer connection conductor 511, and the terminal conductor 312 of the component 31 is connected to the external conductor 412 via the interlayer connection conductor 512. The component 31 does not turn sideways and is not displaced as described above, so that the terminal conductor 311 is reliably connected to the interlayer connection conductor 511, and the terminal conductor 312 is reliably connected to the interlayer connection conductor 512.

Similarly, the terminal conductor 321 of the component 32 is connected to the external conductor 421 via the interlayer connection conductor 521, and the terminal conductor 322 is connected to the external conductor 422 via the interlayer connection conductor 522. The component 32 does not turn sideways and is not displaced as described above, so that the terminal conductor 321 is reliably connected to the interlayer connection conductor 521, and the terminal conductor 322 is reliably connected to the interlayer connection conductor 522.

While there is no illustration, a conductor pattern may be appropriately provided in the laminate 20.

Figure 4:
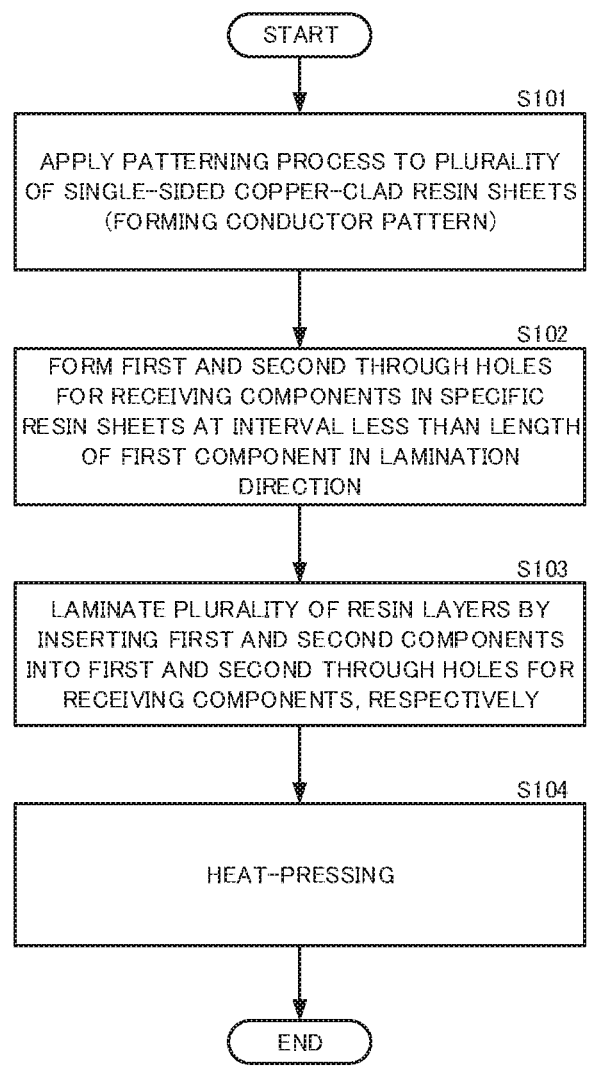
FIG. 4 is a flowchart illustrating a method for manufacturing the component-embedded substrate 10 according to the first preferred embodiment of the present invention.

The component-embedded substrate 10 configured as described above is manufactured as follows. FIG. 4 is a flowchart illustrating a non-limiting example of a method for manufacturing the component-embedded substrate according to the first preferred embodiment of the present invention.

First, a plurality of single-sided copper-clad resin sheets forming the respective plurality of resin layers 21 and 25, and a plurality of resin sheets forming the respective plurality of resin layers 22, 23 and 24, are prepared. Then, a patterning process is applied to the plurality of single-sided copper-clad resin sheets forming the respective plurality of resin layers 21 and 25 (S101). As a result, the resin sheet including the external conductor 411 and the external conductor 412 formed thereon, and the resin sheet including the external conductor 421 and the external conductor 422 formed thereon are manufactured. In these resin sheets, through holes providing interlayer connection are formed and filled with conductive paste.

A plurality of through holes 221 and 222 are formed in the plurality of resin sheets (corresponding to the "specific resin sheet") forming the respective plurality of resin layers 22, 23 and 24 (S102). The through hole 221 and the through hole 222 are disposed side by side in the first direction. A distance between the through hole 221 and the through hole 222 is identical or substantially identical to the distance D described above. That is, the through hole 221 and the through hole 222 are preferably formed at an interval less than the length H1 of the component 31 in the lamination direction. The through hole 221 corresponds to the "first through hole to receive a component", and the through hole 222 corresponds to the "second through hole to receive a component". It is more preferable that the through hole 221 and the through hole 222 are formed at an interval less than both of the length H1 of the component 31 in the lamination direction and the length H2 of the component 32 in the lamination direction.

The plurality of resin layers 21, 22, 23, 24, and 25 are laminated while the component 31 is inserted into the through hole 221 formed in the plurality of resin layers 22, 23, and 24, and the component 32 is inserted into the through hole 222 formed in the plurality of resin layers 22, 23, and 24 (S103).

A laminate of the plurality of resin layers 21, 22, 23, 24, and 25 is heat-pressed (S104). This step causes the resin of the plurality of resin layers 21, 22, 23, 24, and 25 to flow to bond adjacent resin layers to each other. Then, the conductive paste is solidified to form the plurality of interlayer connection conductors 511, 512, 513, and 514. At this time, the component 31 and the component 32 are disposed as described above, so that the component 31 and the component 32 do not turn sideways due to a flow of the resin, and are also not substantially displaced. When the manufacturing method of the present preferred embodiment is used, the component 31 and the component 32 are easily disposed in the positional relationship described above by using the through hole 221 and the through hole 222. Thus, the component-embedded substrate 10 in which turning sideways and displacement of the component 31 and the component 32 are reduced or prevented is easily manufactured.

Figure 5:
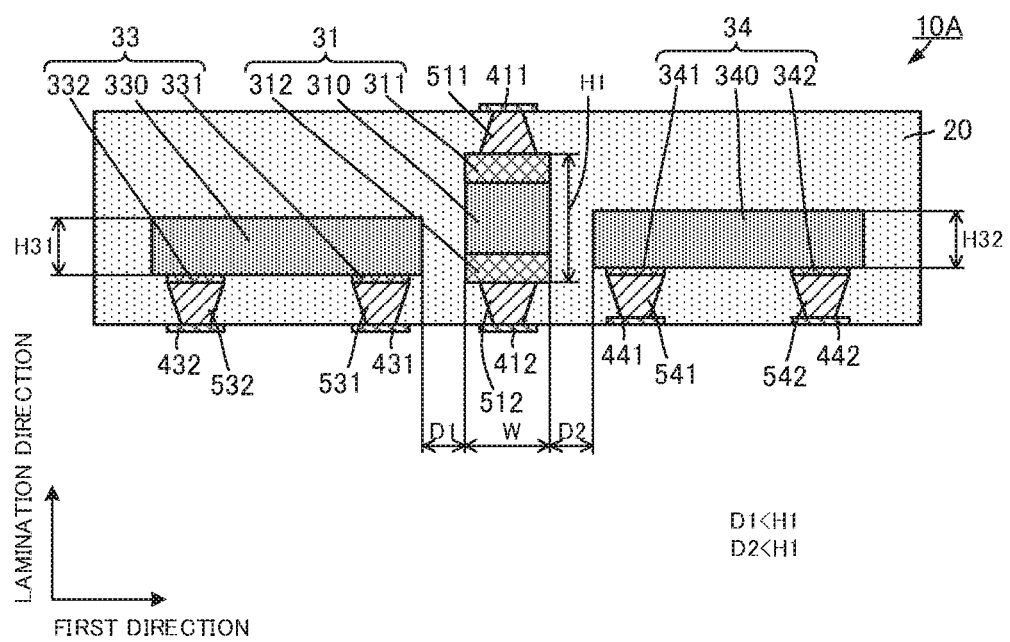
FIG. 5 is a side sectional view illustrating a structure of a component-embedded substrate 10A according to a second preferred embodiment of the present invention.

Next, a component-embedded substrate according to a second preferred embodiment of the present invention will be described with reference to accompanying drawings. FIG. 5 is a side sectional view illustrating structure of a component-embedded substrate 10A according to a second preferred embodiment of the present invention.

The component-embedded substrate 10A according to the present preferred embodiment is different from the component-embedded substrate 10 according to the first preferred embodiment in the number, shape, and placement of components embedded in the laminate 20. The component-embedded substrate 10A includes a laminate 20 that has a basic structure identical or substantially identical to a basic structure of the laminate 20 of the component-embedded substrate 10, and thus, description of the laminate 20 is eliminated.

A component 31 is identical or substantially identical to the component 31 according to the first preferred embodiment, and thus, description thereof is eliminated. The component 31 corresponds to the "first component".

A component 33 includes a component body 330 and a plurality of terminal conductors 331 and 332. The component 33 is harder than the laminate 20. The plurality of terminal conductors 331 and 332 are disposed on a back surface of the component body 330. The component 33 has a height H31. The terminal conductor 331 is connected to an external conductor 431 via an interlayer connection conductor 531, and the terminal conductor 332 is connected to an external conductor 432 via an interlayer connection conductor 532. The component 33 corresponds to the "second component".

A component 34 includes a component body 340 and a plurality of terminal conductors 341 and 342. The component 34 is harder than the laminate 20. The plurality of terminal conductors 341 and 342 are disposed on a back surface of the component body 340. The component 34 has a height H32. The terminal conductor 341 is connected to an external conductor 441 via an interlayer connection conductor 541, and the terminal conductor 342 is connected to an external conductor 442 via an interlayer connection conductor 542. The plurality of external conductors 431, 432, 441, and 442 are provided on the same surface as the external conductor 412. The component 34 corresponds to the "third component".

The component 33 and the component 34 are embedded in the laminate 20. The component 33 and the component 34 are disposed at respective positions overlapping with the component 31 as viewed from a first direction of the laminate 20. The component 33 and the component 34 are disposed across the component 31 in the first direction of the laminate 20. In other words, the component 34 is disposed on a side opposite to the component 33 with respect to the component 31 in the first direction.

A distance D1 between the component 31 and the component 33 in the first direction is preferably less than a length H1 of the component 31 in a lamination direction. A distance D2 between the component 31 and the component 34 in the first direction is preferably less than the length H1 of the component 31 in the lamination direction.

The structure described above causes the component 31 to be less likely not only to turn sideways on both a component 33 side and a component 34 side, but also to be displaced. As a result, turning sideways and displacement of the component 31 due to a flow of resin is more reliably reduced or prevented.

The component 31 and the component 33 are preferably disposed so as to satisfy the following: $D1<(W/H1)\cdot H31$, where W is a length of the component 31 in the first direction. This structure prevents the component 31 from turning sideways by being supported by the component 33 even when the component 31 is inclined by the flow of the resin, and thus the component 31 easily returns to its original position due to a self-alignment effect, for example.

Similarly, the component 31 and the component 34 are preferably disposed so as to satisfy the following: $D2<(W/H1)\cdot H32$, where W is the length of the component 31 in the first direction. This structure prevents the component 31 from turning sideways by being supported by the component 34 even when the component 31 is inclined by the flow of the resin, and thus the component 31 easily returns to its original position due to a self-alignment effect, for example.

The relationship of the dimensions expressed by the following: $D1<(W/H1)\cdot H31$; and $D2<(W/H1)\cdot H32$, may also be applied to the case in which the number of components is two, as described in the first preferred embodiment. Specifically, when it is applied to the first preferred embodiment, the following relationship may preferably be satisfied: $D<(W1/H1)\cdot H2$.

Figure 6A:
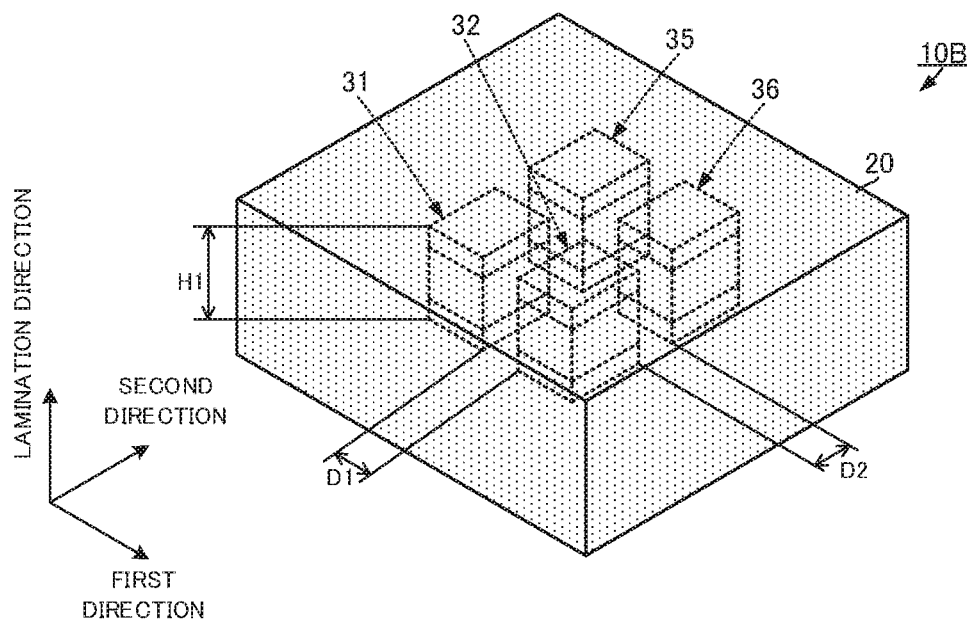
FIG. 6A is a perspective view illustrating a structure of a component-embedded substrate 10B according to a third preferred embodiment of the present invention.
Figure 6B:
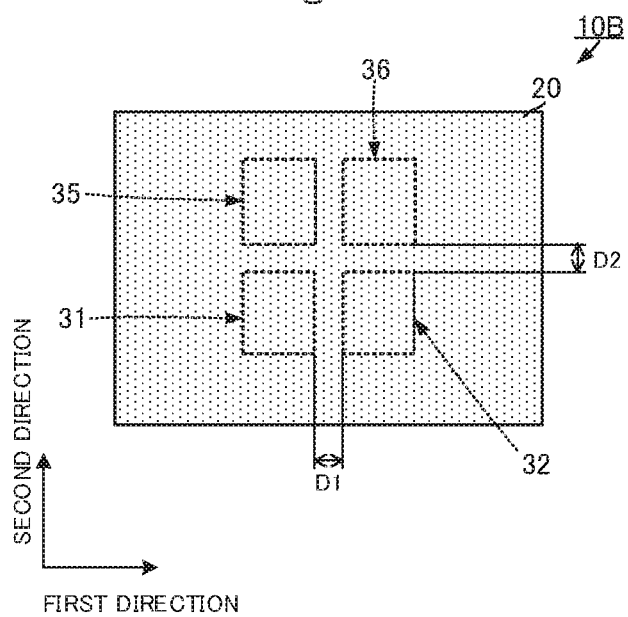
FIG. 6B is a plan view illustrating the structure of the component-embedded substrate 10B according to the third preferred embodiment of the present invention.

Next, a component-embedded substrate according to a third preferred embodiment of the present invention will be described with reference to accompanying drawings. FIG. 6A is a perspective view illustrating structure of a component-embedded substrate 10B according to a third preferred embodiment of the present invention. FIG. 6B is a plan view illustrating the structure of the component-embedded substrate 10B according to the third preferred embodiment of the present invention. While illustration of interlayer connection conductors and external conductors is omitted in FIGS. 6A and 6B to enable a positional relationship of a plurality of components embedded in a laminate to be easily understood, the interlayer connection conductors and the external conductors are preferably provided for each of a plurality of components as in the first preferred embodiment.

The component-embedded substrate 10B according to the present preferred embodiment is different from the component-embedded substrate 10 according to the first preferred embodiment in the number and placement of components embedded in a laminate 20. The component-embedded substrate 10B includes the laminate 20 that has a basic structure identical or substantially identical to a basic structure of the laminate 20 of the component-embedded substrate 10, and thus description of identical or substantially identical points is omitted.

The component-embedded substrate 10B includes a plurality of components 31, 32, 35, and 36. The plurality of components 31, 32, 35, and 36 each preferably has the same or substantially the same shape. All of the plurality of components 31, 32, 35, and 36 may not have the same shape, and may be disposed in the following positional relationship.

The component 31 and the component 32 are disposed side by side in the first direction. The component 31 and the component 35 are disposed side by side in a second direction (a direction orthogonal or substantially orthogonal to a lamination direction and the first direction). The component 35 and the component 36 are disposed side by side in the first direction. The component 32 and the component 36 are disposed side by side in the second direction. That is, the plurality of component 31, 32, 35, and 36 are preferably disposed in a two-dimensional array in plan view. The plurality of component 31, 32, 35, and 36 is disposed at respective overlapping positions as viewed from the first direction or the second direction. Specifically, the component 31 and the component 32 overlap with each other as viewed from the first direction, and the component 35 and the component 36 overlap with each other as viewed from the first direction. The component 31 and the component 35 overlap with each other as viewed from the second direction, and the component 32 and the component 36 overlap with each other as viewed from the second direction. When the component 31 corresponds to the "first component", the component 32 corresponds to the "second component", and the component 35 corresponds to the "fourth component". When the component 32 corresponds to the "first component", the component 31 corresponds to the "second component", and the component 36 corresponds to the "fourth component". When the component 35 corresponds to the "first component", the component 36 corresponds to the "second component", and the component 31 corresponds to the "fourth component". When the component 36 corresponds to the "first component" of the present invention, the component 35 corresponds to the "second component", and the component 32 corresponds to the "fourth component".

A distance D1 between the component 31 and the component 32 in the first direction is preferably less than a length H1 of the component 31 in the lamination direction. A distance D2 between the component 31 and the component 35 in the second direction is preferably less than the length H1 of the component 31 in the lamination direction.

This structure causes the component 32 to be disposed close to the component 31 in the first direction orthogonal or substantially orthogonal to the lamination direction, and the component 35 to be disposed close to the component 31 in the second direction. As a result, the component 31 is less likely to turn sideways in both the first direction and the second direction, and is less likely to be displaced. Similarly, the component 32, the component 35, and the component 36 are also less likely to turn sideways in both the first direction and the second direction, and are less likely to be displaced.

As described above, the structure of the component-embedded substrate 10B of the present preferred embodiment more reliably reduces displacement of components embedded in the laminate 20.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A component-embedded substrate comprising:
   a laminate including a plurality of resin layers each made of thermoplastic and laminated together in a lamination direction; and
   a first component and a second component embedded in the laminate;
   wherein the first component has a length in the lamination direction greater than a length of the first component in a direction orthogonal or substantially orthogonal to the lamination direction;
   the first component and the second component are disposed adjacent to each other in a first direction orthogonal or substantially orthogonal to the lamination direction, and are disposed at respective positions overlapping with each other as viewed from the first direction;
   a distance between the first component and the second component in the first direction is less than the length of the first component in the lamination direction; and
   each of the first component and the second component includes a component body and a plurality of terminal conductors;
   the laminate includes external conductors disposed on outer surfaces of the laminate;
   each of the plurality of terminal conductors of the first component is connected to a respective one of the external conductors via a first interlayer connection conductor;
   each of the plurality of terminal conductors of the second component is connected to a respective one of the external conductors via a second interlayer connection conductor;
   the component body of the first component, the plurality of terminal conductors of the first component, and the respective ones of the external conductors connected to the plurality of terminal conductors of the first component are aligned or substantially aligned in the lamination direction of the plurality of resin layers; and
   the component body of the second component, the plurality of terminal conductors of the second component, and the respective ones of the external conductors connected to the plurality of terminal conductors of the second component are aligned or substantially aligned in the lamination direction of the plurality of resin layers.

2. The component-embedded substrate according to claim 1, wherein the distance between the first component and the second component in the first direction is less than the length of the second component in the lamination direction.

3. The component-embedded substrate according to claim 1, further comprising:
   a third component embedded in the laminate and disposed at a position overlapping with the first component as viewed from the first direction; wherein
   the third component is disposed on a side opposite to the second component with respect to the first component in the first direction.

4. The component-embedded substrate according to claim 3, further comprising:
   a fourth component embedded in the laminate, the fourth component being disposed adjacent to the first component in a second direction orthogonal or substantially orthogonal to the lamination direction at a position overlapping with the first component as viewed from the second direction; wherein
   a distance between the first component and the fourth component in the second direction is less than the length of the first component in the lamination direction.

5. The component-embedded substrate according to claim 4, wherein the first, second, third, and fourth components are disposed in a two-dimensional array in plan view.

6. The component-embedded substrate according to claim 4, wherein the first, second, third, and fourth components have a same or substantially a same shape.

7. The component-embedded substrate according to claim 1, further comprising:
   a fourth component embedded in the laminate, the fourth component being disposed adjacent to the first component in a second direction orthogonal to the lamination direction at a position overlapping with the first component as viewed from the second direction; wherein
   a distance between the first component and the fourth component in the second direction is less than the length of the first component in the lamination direction.

8. The component-embedded substrate according to claim 1, wherein the plurality of resin layers are each mainly made of a liquid crystal polymer.

9. The component-embedded substrate according to claim 1, wherein the first and second components are harder than the laminate.

10. The component-embedded substrate according to claim 1, wherein the length of the first component in the lamination direction and the length of the second component in the lamination direction are identical or substantially identical.

11. The component-embedded substrate according to claim 1, wherein a distance, in the first direction, between a surface of the first component on a side opposite to the second component and a surface of the second component on a side opposite to the first component is greater than the length of the component in the lamination direction.

12. The component-embedded substrate according to claim 1, wherein the first and second components have a same or substantially a same shape.

* * * * *